United States Patent
Matsushima et al.

(10) Patent No.: US 7,675,748 B2
(45) Date of Patent: Mar. 9, 2010

(54) DISK ARRAY SYSTEM

(75) Inventors: Hitoshi Matsushima, Ryugasaki (JP);
Takayuki Atarashi, Tsuchiura (JP);
Hiroshi Fukuda, Odawara (JP);
Shunsuke Yamana, Odawara (JP)

(73) Assignee: Hitachi, Ltd., Tokyo (JP)

( * ) Notice: Subject to any disclaimer, the term of this patent is extended or adjusted under 35 U.S.C. 154(b) by 1442 days.

(21) Appl. No.: 11/043,994

(22) Filed: Jan. 28, 2005

(65) Prior Publication Data

US 2006/0077776 A1 Apr. 13, 2006

(30) Foreign Application Priority Data

Sep. 2, 2004 (JP) ............... 2004-255518

(51) Int. Cl.
*H05K 7/20* (2006.01)
*G06F 1/20* (2006.01)
(52) U.S. Cl. .............. 361/679.53; 361/699; 361/679.47
(58) Field of Classification Search ............ 361/679.53, 361/699, 679.47
See application file for complete search history.

(56) References Cited

U.S. PATENT DOCUMENTS

| | | | | |
|---|---|---|---|---|
| 4,493,010 A | * | 1/1985 | Morrison et al. | 361/698 |
| 5,414,591 A | * | 5/1995 | Kimura et al. | 361/695 |
| 6,115,251 A | * | 9/2000 | Patel et al. | 361/699 |
| 6,144,553 A | * | 11/2000 | Hileman et al. | 361/679.52 |
| 6,560,107 B1 | * | 5/2003 | Beck et al. | 361/699 |
| 6,778,387 B2 | * | 8/2004 | Fairchild | 361/679.53 |
| 7,457,112 B2 | * | 11/2008 | Fukuda et al. | 361/679.48 |
| 2001/0036061 A1 | * | 11/2001 | Donahoe et al. | 361/687 |
| 2003/0147214 A1 | * | 8/2003 | Patel et al. | 361/699 |
| 2004/0008483 A1 | * | 1/2004 | Cheon | 361/687 |
| 2004/0100770 A1 | * | 5/2004 | Chu et al. | 361/698 |
| 2004/0264133 A1 | * | 12/2004 | Fukuda et al. | 361/695 |
| 2005/0068728 A1 | * | 3/2005 | Chu et al. | 361/690 |

FOREIGN PATENT DOCUMENTS

| | | |
|---|---|---|
| JP | 2000-156077 | 6/2000 |
| JP | 2001-332978 | 11/2001 |
| JP | 2003-347781 | 12/2003 |

* cited by examiner

*Primary Examiner*—Anatoly Vortman
(74) *Attorney, Agent, or Firm*—Antonelli, Terry, Stout & Kraus, LLP.

(57) ABSTRACT

A disk array system includes a plurality of disk drives and at least one unit box including the plurality of disk drives aligned in the thickness direction of the disk drive, each disk drive including a thin case accommodating a recording disk, a read/write head, and a driving mechanism for driving the recording disk and the read/write head, and a control board for controlling the driving mechanism, the control board being mounted on the thin case. In the disk array system, the thin case and the unit box are composed of a thermally-conductive material, the unit box includes surfaces parallel to the thickness direction of the plurality of disk drives, and at least one of the surfaces has a cold plate filled with a refrigerant. Heat generated at the disk drives is transferred to the cold plate, thereby improving cooling performance.

17 Claims, 15 Drawing Sheets

DISK ARRAY SYSTEM

BACKGROUND OF THE INVENTION

1. Field of the Invention

The present invention relates to a disk array system including a plurality of disk drives that drive disk recording media, and more particularly, to a technique for cooling the disk drives.

2. Description of the Related Art

With advances in computer technology, high-density modularization and integration of electronic devices for computing systems are being carried out. For example, a compact disk array system including a plurality of disk drives that is highly modularized has been proposed as a recording medium for recording information necessary for a computer system. The highly-modularized disk drives each have a low-profile construction, including a magnetic or optical disk recording medium (recording disk), a disk unit including a read/write head for recording/reproducing information on/from the recording disk in a thin case, a controlling circuit for controlling the disk and the head in the disk unit, a control board including a controlling circuit for controlling the recording disk and the head in the disk unit, and a connector for connecting the control board to an external controlling device. The thin case for the disk unit accommodates a driving motor for rotating the recording disk and a driving mechanism including an actuator for controlling the recording medium.

With the disk array system, for the purpose of improving reliability of data storage of the recording disk, the disk drives are accommodated in a plurality of unit boxes stacked one on another and two columns of the tiered unit boxes are disposed back-to-back. This type of large disk array system is applied to a high-capacity storage device. The disk array system can be used for a redundant array of independent disks (RAID), or by connecting disk drives via a high-speed special-purpose network such as an optical network and controlling the drives with software, the disk array system can be used for a storage device in a storage area network (SAN) or in a software redundant array of independent disk (NAS).

When densely-integrated disk drives are aligned and accommodated in a unit box, heat from the disk drives raises the temperature of the unit box, resulting in malfunction in devices constituting the disk drives. Electronic devices generating heat in the disk drive are a driving motor, an actuator, and an LSI constituting a controlling circuit. To address this problem, cooling the disk drives is essential.

In a known disk array system, a cooling fan for blowing cooling air over the vicinities of the heating disk drives is disposed in a casing where the heating disks are accommodated. If cooling is not well performed, the temperatures of the disk drives increase or differ from disk drive to disk drive, resulting in operational malfunction or low long-term reliability of the disk array system.

To address the aforementioned problem, a technique to provide a heat-dissipation mechanism, such as fins, in a disk unit has been proposed. With this technique, cooling air can readily pass through a large heat dissipation area, thereby improving cooling performance (see Japanese Unexamined Patent Application Publication Nos. 2000-156077, 2001-332978, and 2003-347781).

Furthermore, with the disk array systems, even higher-capacity recording disks and higher-density disk drives are demanded.

However, when the aforementioned heat dissipation mechanism such as fins is disposed in the disk unit, one disk drive takes up a lot of space in the unit box, resulting in decreased density of the disk drives in the unit box. Because of this, the fin cannot be made large, whereby cooling performance is degraded.

When the disk drives are densely integrated without providing the fins in the disk unit and heat is dissipated from the surface of the disk unit itself, cooling air passes through extremely slim gaps, e.g. several millimeters, between the disk drives. In this case, since the cooling performance is greatly influenced by the deviation of the installation positions of the disk drives, the temperature increase of the disk drives differs depending on the position. Due to this variation in temperature increase, the temperatures of some disk drives may exceed the tolerance temperature. To prevent this problem, the gaps between the disk drives need to be made larger, which conflicts with the high-density packaging requirement.

SUMMARY OF THE INVENTION

It is an object of the present invention to provide a disk array system in which densely-packed disk drives are cooled effectively.

A disk array system according to the present invention includes a plurality of disk drives and at least one unit box including the plurality of disk drives aligned in the thickness direction of the disk drive, the plurality of disk drives including a thin case accommodating a recording disk, a read/write head, and a driving mechanism for driving the recording disk and the read/write head and a control board for controlling the driving mechanism, the control board being mounted on the thin case. In this disk array system, the thin case and the unit box are composed of a thermally-conductive material, the unit box has surfaces parallel to the thickness direction of the plurality of disk drives, and at least one of the surfaces of the unit box has a heat absorption unit filled with a refrigerant. Preferably, the disk array system includes another unit box stacked on the unit box, the top surface of the top unit box and the lower surface of the bottom unit box having the heat absorption unit.

More specifically, the surfaces parallel to the thickness direction of the plurality of disk drives are the top and bottom surfaces of the unit box with large areas. Since the heat absorption unit filled with a refrigerant is provided at least one of the surfaces of the unit box, heat from the disk drives is effectively transferred to the heat absorption unit. More specifically, since the temperature of the side surfaces of the unit box is reduced by the heat absorption unit, heat generated at the disk drives in the thin cases or LSIs on the control board is transferred to the side surfaces of the unit box due to the temperature difference between the surfaces of the unit box and the heating elements, thereby cooling the disk drives effectively. Specifically, the heat absorption unit is sufficiently cooled with the refrigerant having a higher cooling performance than that of air. Examples of the refrigerant include liquid such as water and a gas-liquid two-phase refrigerant with a low boiling point. Furthermore, since the refrigerant keeps the temperature of the heat absorption unit at a certain temperature, variation in the temperature from disk drive to disk drive is reduced, resulting in improved reliability and long service life of the disk drive. Hence, a densely-packed, high-capacity, and high-speed disk drive can be achieved.

Preferably, resistance of thermal conductivity from the disk drives to the unit box is small. Typically, the disk drives are accommodated in a box-shaped housing composed of thermally-conductive material and the housing is removably disposed in the housing. Accordingly, heat from the disk drives is transferred to the housing composed of a thermally-conductive material through the thin case composed of a thermally-conductive material and then is transferred from the housing to the side surfaces of the unit box. Therefore, it is preferred to make the thermal resistance of the thermal transfer route small.

Since the housing is removably disposed in the unit box, preferably, a heat-transfer accelerating unit is disposed between inner surfaces of the unit box and side surfaces of the housing facing the inner surfaces of the unit box so as to fill the gap between the inner surfaces of the unit box and the side surfaces of the housing, the heat-transfer accelerating unit accelerating thermal coupling of the unit box and the housing. The heat-transfer accelerating unit may be composed of thermally-conductive rubber, thermally-conductive grease, or a thermally-conductive spring. Alternatively, the heat-transfer accelerating unit may be a guiding groove for inserting/removing the housing into/from the unit box, the guiding groove engaging the side surfaces of the housing and the inner surfaces of the unit box. Preferably, to decrease the thermal resistance from the disk drives to the thin case, an outer surface of the thin case is attached to an inner bottom surface of the housing through a thermally-conductive flexible component, such as thermally-conductive grease.

Preferably, the heat absorption unit of the present invention is composed of a plate including a refrigerant channel through which the refrigerant passes, and ducts connect two edges of the refrigerant channel in the heat absorption unit to two respective edges of a refrigerant channel in a radiator disposed remote from the unit box.

Preferably, the radiator is disposed above the unit box, and the refrigerant spontaneously circulates through the heat absorption unit, the ducts, and the radiator. Alternatively, the refrigerant may be a gas-liquid two-phase refrigerant, a compressor for compressing the refrigerant may be disposed at one of the ducts, and a decompressor may be disposed at the other duct to establish a cooling cycle. Alternatively, a pump for circulating the refrigerant may be disposed at one of the ducts such that liquid such as water or antifreeze serving as a refrigerant may be circulated. Furthermore, cooling fan for cooling the radiator may be provided.

When the thin case is disposed close to the back of the unit box, preferably the refrigerant channel in the heat absorption unit meanders along the longitudinal direction of the unit box such that the refrigerant flows through the refrigerant channel from the back to the front of the unit box. Accordingly, heat of the thin case can be cooled with the refrigerant with a low temperature.

Preferably, the heat absorption unit includes at least one heat pipe filled with the refrigerant, one end of the heat pipe being connected to the heat absorption unit, and a radiator is disposed at the other end of the heat pipe. Furthermore, preferably, the heat absorption unit is a cold plate having a space filled with the refrigerant, the cold plate constituting the surface of the unit box, the cold plate having at least one fin on an outer surface of the cold plate.

DESCRIPTION OF THE PREFERRED EMBODIMENTS

First Embodiment

Figure 1:
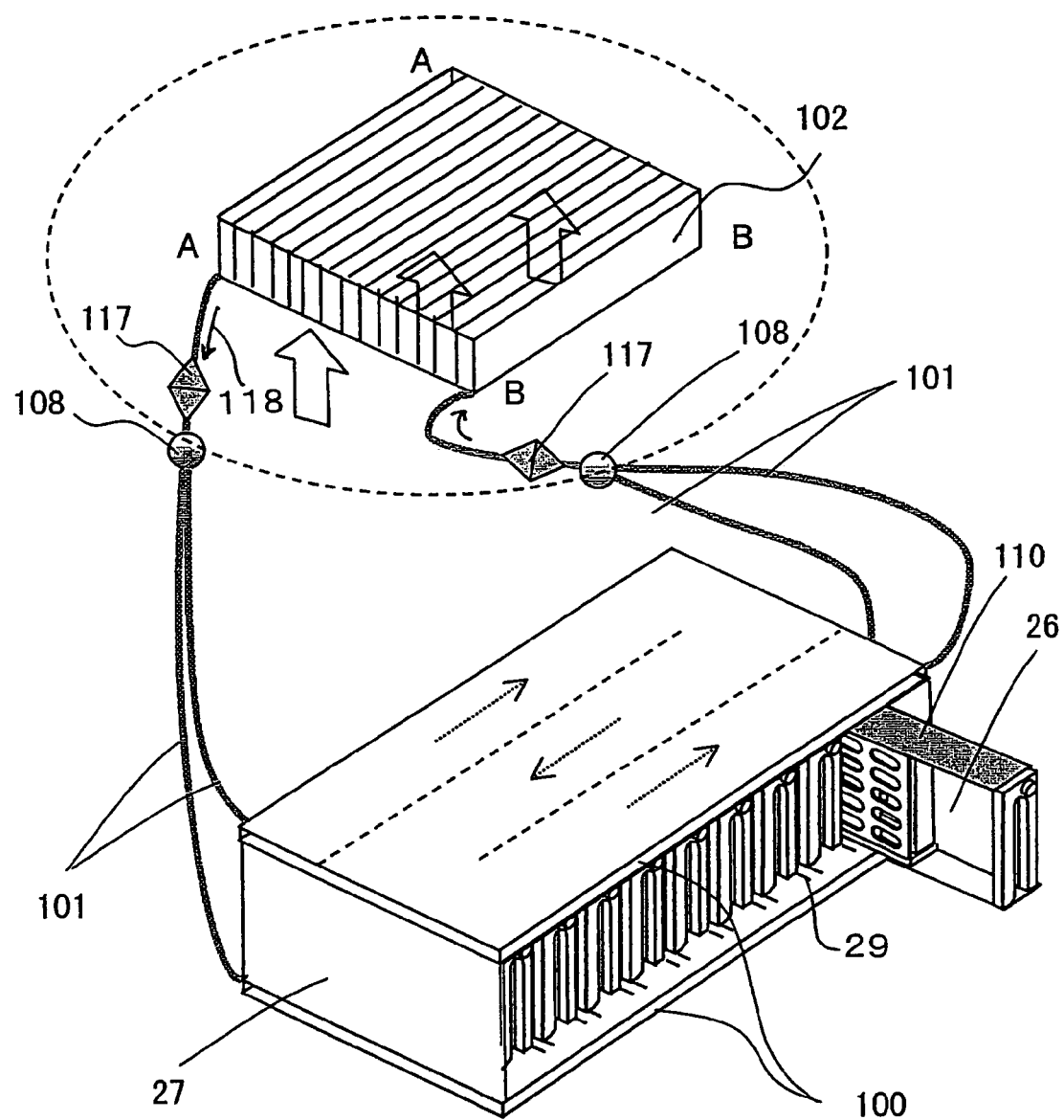
FIG. 1 is a perspective view of a disk array system according to a first embodiment.
Figure 2:
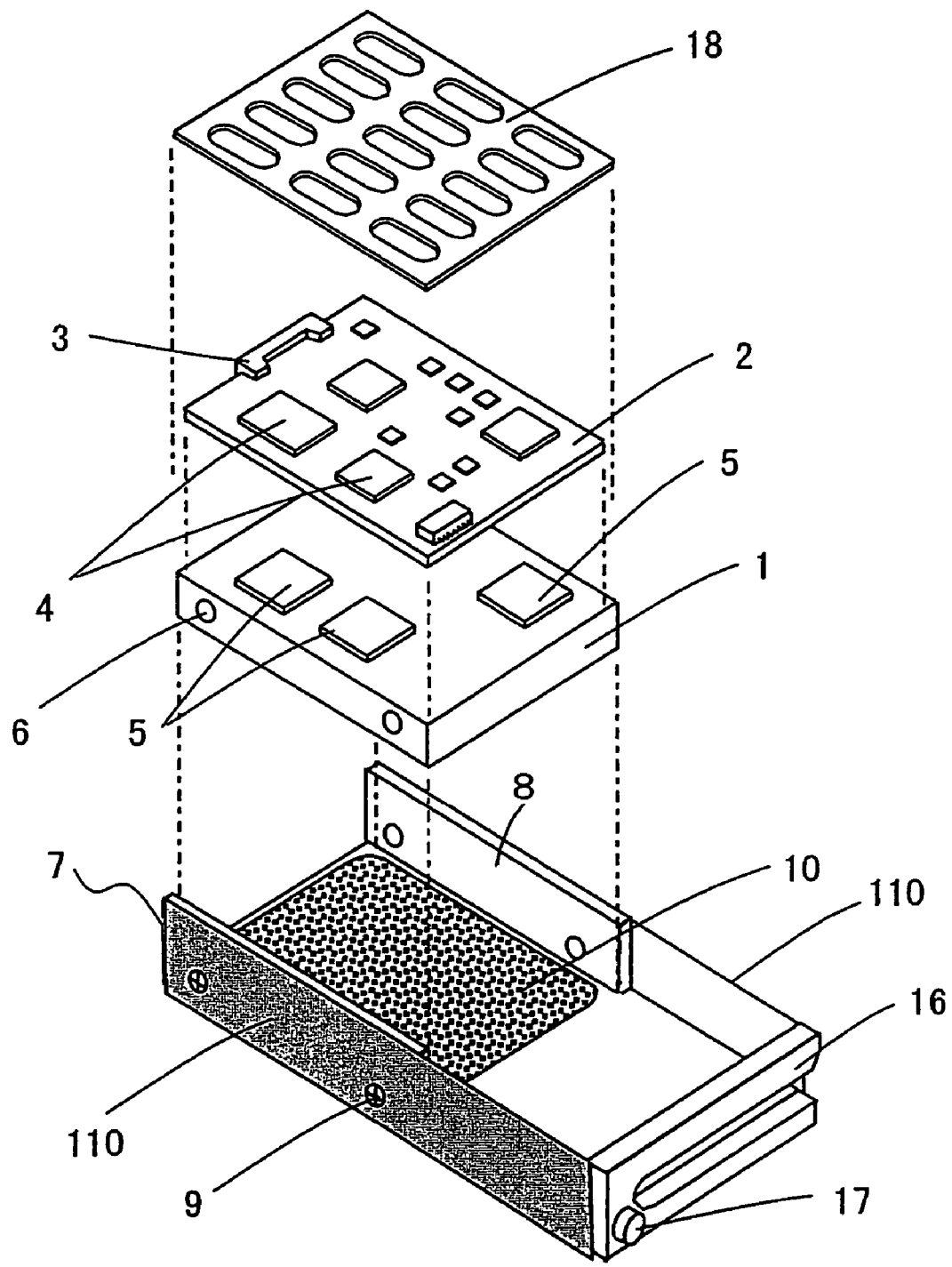
FIG. 2 is an exploded view of a disk drive according to the first embodiment.

A first embodiment of the present invention will now be described by referring to FIGS. 1 and 2. FIG. 1 is a perspective view of a disk array system according to the first embodiment. FIG. 2 is an exploded view of a disk drive according to the first embodiment. Referring to FIG. 2, a disk drive 26 includes a disk body 1, a control board 2, a cover 18 for covering the control board 2, and a housing 7. The disk body 1, the control board 2, and the cover 18 are assembled in this order and accommodated in the box-shaped housing 7. Although not illustrated in the drawing, the disk body 1 contains, in a thin case composed of a thermally-conductive material, a magnetic disk, a motor for rotating the magnetic disk, a read/write head for recording information onto the magnetic disk and for reproducing information recorded on the magnetic disk, and an actuator for driving the read/write head, for example.

The control board 2 disposed on the disk body 1 includes controlling circuits including LSIs 4 for controlling the motor and the actuator in the disk body 1 and a connector 3 for transmitting and receiving a voltage or a controlling signal to/from a main circuit board, which will be described below. Thermally-conductive sheets 5 are disposed between the LSIs 4 in the control board 2 and the disk body 1. The disk body 1 and the LSIs 4 generate heat. The thermally-conductive sheets 5 allow heat radiating from the LSIs 4 to be readily transferred to the disk body 1.

The box-shaped housing 7 is composed of a thermally-conductive material with the top surface and the back surface open. The disk body 1 is fixed to the housing 7 by inserting screws 9 into screw holes 6 disposed on the side surfaces of the disk body 1 and screw holes in guide plates 8 disposed on the inner surfaces of the housing 7. An engageable unit 16 is disposed on the front surface of the housing 7 and is to be inserted into or removed from a unit box, which will be described below. A release button 17 is disposed on the engageable unit 16. The disk drive 26 is provided with a locking mechanism (not shown) that prevents the disk drive 26 from being readily detached from the unit box. A known locking mechanism can be used in the disk drive 26. Pushing the release button 17 detaches the disk drive 26 from the unit box.

Preferably, the thin case for the disk body 1 and the housing 7 are composed of highly thermally conductive material. Examples of the conductive material include copper, aluminum, and a carbonaceous material, e.g., carbon fiber, carbon composite, or carbon nanotube. When the thin case and the housing 7 are composed of the aforementioned material, heat radiating from the disk body 1 can be effectively transmitted in the housing 7. Since the housing 7 is thermally coupled to the disk body 1 via thermally conductive grease 10, heat from the disk body 1 and the control board 2 can be collectively transferred to the housing 7. Heat-transfer-accelerating units 110 are disposed on the side surfaces of the housing 7.

Figure 6:
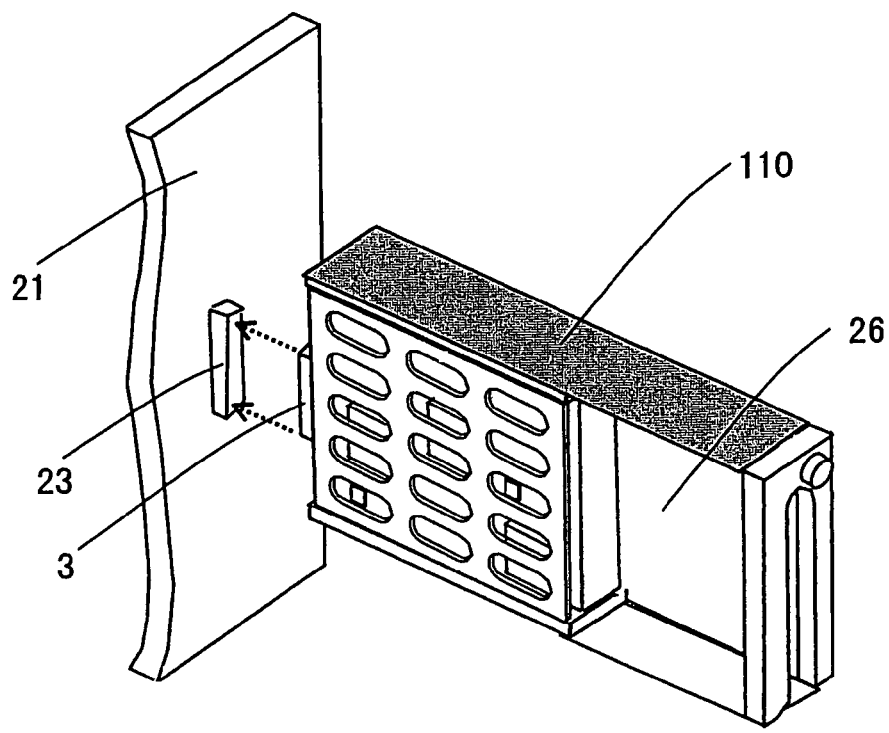
FIG. 6 is a perspective view of a housing of the first embodiment to be attached to a main circuit board.

Now, referring to FIG. 1, a plurality of the disk drives 26 each including the cover 18, the control board 2, and the disk body 1 in the housing 7 are aligned and accommodated in a unit box 27. The unit box 27 has open front and back surfaces. The top and bottom surfaces are composed of cold plates or heat absorption units 100. The gap between the top cold plate 100 and the bottom cold plate 100 is slightly larger than the gap between the side surfaces of the housing 7. In this way, the disk drives 26 are removably disposed in the unit box 27 such that the housings 7 are in the upright position, that is, the heat-transfer-accelerating units 110 are in contact with the inner surfaces of the unit box 27. Guide rails 29 for guiding the housings 7 into the unit box 27 are disposed on the inner surfaces of the cold plates 100. Referring to FIG. 6, a main circuit board 21 is disposed so as to cover the entire back surface of the unit box 27. The disk drives 26 encased in the unit box 27 are electrically coupled to connectors 23 in the main circuit board 21 via the connectors 3. The connectors 3 in the disk drives 26 and the connectors 23 in the main circuit board 21 are aligned by the guide rails 29 with ease.

The disk drives 26 in the unit box 27 are thermally coupled to the top and bottom cold plates 100 through the heat-transfer-accelerating units 110 disposed on the side surfaces of the housings 7. Heat transmitted from the disk body 1 to the bottom surface and the side surfaces of the housing 7 via the grease 10 and the guide plates 8 is then transmitted to the cold plates 100 through the heat-transfer-accelerating units 110.

The heat-transfer-accelerating units 110 fill the gap between the housings 7 and the cold plates 100 in the unit box 27 such that the housings 7 are thermally coupled to the cold plates 100. Therefore, the heat-transfer-accelerating units 110 are preferably composed of a thermally conductive material having flexibility, such as thermally conductive grease or thermally conductive rubber. When the heat-transfer-accelerating units 110 are composed of the aforementioned material, variations in temperature increase due to the difference in how well the disk drives 26 are fitted to the unit box 27 are suppressed.

A refrigerant channel through which a refrigerant passes is disposed in the cold plates 100. Each cold plate 100 is composed of two thermally-conductive flat plates having partitioning strips therebetween, which define the meandering refrigerant channel illustrated in FIG. 1. Alternatively, the cold plate 100 may be composed of top and bottom metal plates. Projecting strips may be formed on the top metal plate by press work at positions corresponding to the partitioning strips and brazed to the bottom metal plate, thereby defining a refrigerant channel. Alternatively, a meandering metal duct serving as a refrigerant channel may be thermally coupled to the bottom plate.

The refrigerant of the first embodiment is composed of a gas-liquid two-phase refrigerant such as R134a. A pair of ducts 101 connects both ends of the refrigerant channels in the cold plates 100 to a radiator 102. That is, the refrigerant channel in the cold plates 100 communicates with a refrigerant channel in the radiator 102 through the ducts 101, thereby establishing a refrigerant circulating system. In the first embodiment, branch connections 108 are provided at the ducts 101 in order to connect the two cold plates 100 to the single radiator 102. The joints 117 are also provided at the ducts 101 to separate the unit box 27 from the radiator 102. Because of the provision of the joints 117, the disk array system can be readily assembled, thereby improving the productivity of manufacturing the disk array system.

In the disk array system of the first embodiment, a temperature at which the refrigerant vaporizes in the cold plates 100 or condenses in the radiator 102 can be readily adjusted within the range from below zero degrees Celsius to several tens of degrees Celsius, depending on the pressure applied when filling the gas-liquid two-phase refrigerant. Since the disk array system of the first embodiment does not employ a compressor and an expansion valve for the refrigerant circulating system, which are typically used in a cooling cycle such as in an air conditioner, the vaporizing temperature and condensing temperature of the refrigerant are almost identical.

The flat-plate-shaped radiator 102 is tilted in the disk array system of the first embodiment. Referring to FIG. 1, when the refrigerant flows in the direction indicated by arrows 118, the radiator 102 is tilted such that the side A-A from which the refrigerant is discharged is lower than the side B-B from which the refrigerant is input. In this way, the liquid refrigerant, which is condensed in the radiator 102, flows towards the side A-A due to gravity, whereby the liquid refrigerant can be effectively supplied to the cold plates 100.

Preferably, the liquid refrigerant entering the back surfaces of the cold plates 100 of the unit box 27 flows through the meandering channel in the cold plates 100 across the plurality of disk drives 26 to be discharged from the front surfaces of the cold plates 100. Accordingly, the vicinities of the disk bodies 1 can be cooled mainly due to vaporization of the liquid refrigerant, while all the disk drives 26 are uniformly cooled.

Preferably, a sufficient amount of the refrigerant is necessary so that the liquid does not run out in the cold plates 100. However, even if the liquid runs out in the cold plates 100 and thus the entire refrigerant becomes gas, cooling of the disk drives 26 is not influenced by this due to the aforementioned structure of the refrigerant channel with which the vicinities of the heating disk bodies 1 can be cooled mainly with the refrigerant having a low temperature.

The heat transfer in the disk array system of the first embodiment will now be described. Heat transmitted to the housings 7 from the disk bodies 1 is transferred to the cold plates 100 through the heat-transfer-accelerating units 110. The heat is absorbed in the cold plates 100 due to vaporization of the refrigerant in the cold plates 100, which, in turn, converts the refrigerant from a liquid phase to a gas phase. Then, the gas refrigerant flows into the radiator 102 disposed above the cold plates 100 due to buoyancy. The radiator 102 radiates the heat of the gas refrigerant and thus the refrigerant is converted from a gas phase into a liquid phase. Then, the liquid refrigerant flows back to the cold plates 100 disposed below the radiator 102 due to the difference in density. Accordingly, the heat generated in the disk bodies 1 is transferred to the radiator 102. The heat absorbed in the radiator 102 can be dissipated by conversion of atmospheric air or by cooling the radiator 102 with a fan.

In the disk array system of the first embodiment, since a compressor or a pump, which generates heat, is not provided in the refrigerant circulating system, reliability of the cooling system is dramatically improved. Furthermore, since the vaporizing temperature in the cold plates 100 is fixed depending on the pressure applied when filling the refrigerant, the temperatures of the aligned disk drives 26 in the unit box 27 are kept uniform.

Second Embodiment

Figure 3:
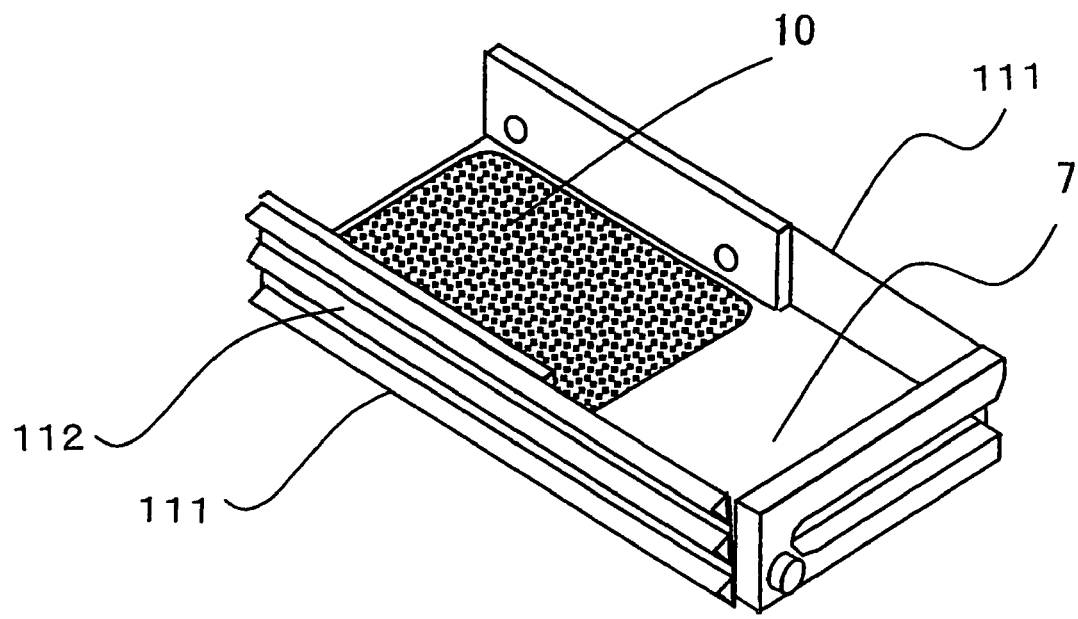
FIG. 3 is a perspective view of a housing in a disk array system according to a second embodiment of the present invention.

FIG. 3 is a perspective view of a housing 7 in a disk array system according to a second embodiment of the present invention. The disk array system of the second embodiment is different from that of the first embodiment shown in FIG. 2 in that projecting strips 112 having triangular cross-sections are disposed on the side surfaces of the housing 7 so as to extend in the longitudinal direction of the housing 7, in place of the heat-transfer-accelerating units 110 of the first embodiment. In the unit box 27, grooves (not shown) are disposed so as to correspond to the projecting strips 112. Accordingly, the housings 7 and the unit box 27 are connected over a sufficiently large contacting area, thereby accelerating the thermal transfer. Moreover, when thermally-conductive grease is applied to the surfaces of the projecting strips 112, thermal transfer is even further accelerated. The projecting strips 112 may also function as guide rails when the housings 7 are inserted into the unit box 27.

Third Embodiment

Figure 4:
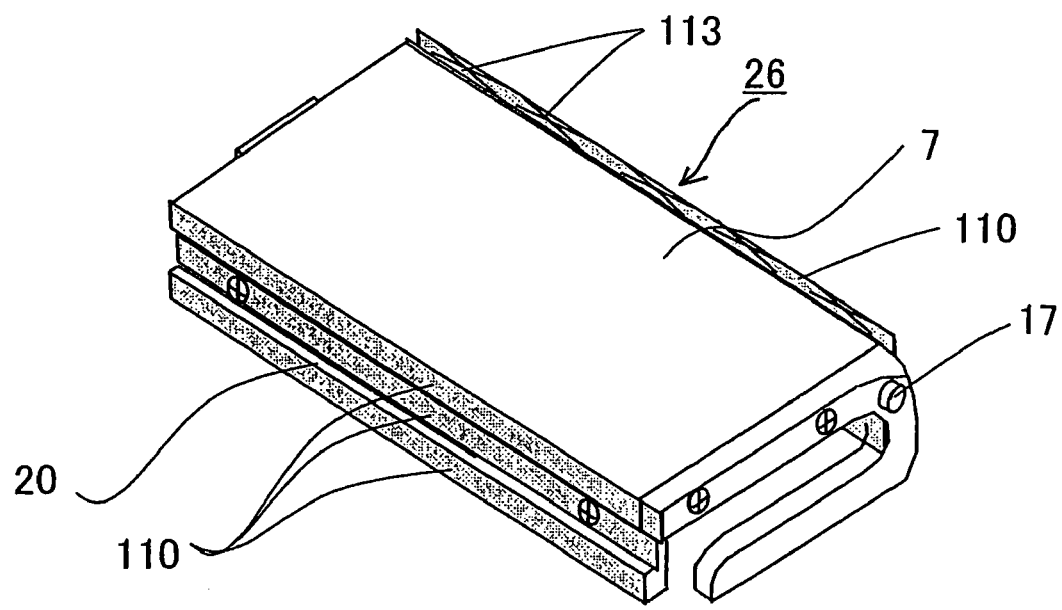
FIG. 4 is a perspective view of a housing in a disk array system according to a third embodiment.

FIG. 4 is a perspective view of a housing 7 in a disk array system according to a third embodiment. In FIG. 4, the housing 7 is upside down with the bottom surface facing up. The disk array system of the third embodiment is different from that of the first embodiment shown in FIG. 2 in that guide rails 20 including protruding strips are disposed on one side surface of the housing 7 and a heat-transfer-accelerating unit 110 composed of thermally-conductive rubber is disposed on the surfaces of the protruding strips. The guide rails 20 facilitate positioning of the disk drive 26 when the disk drive 26 is inserted into or removed from the unit box 27.

Figure 5:
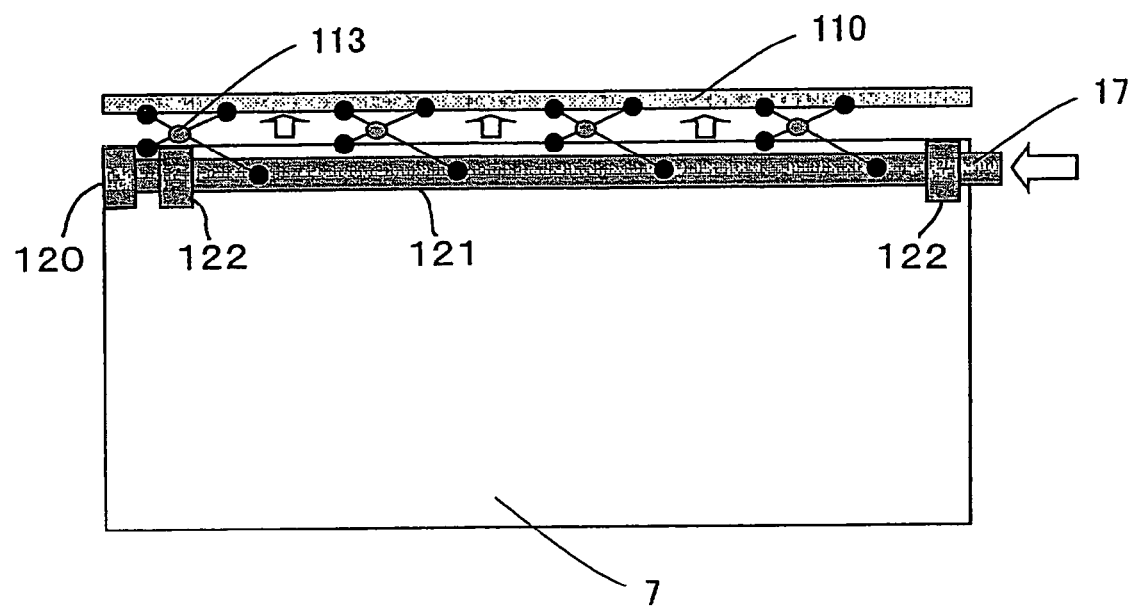
FIG. 5 is a plan view of a housing and its vicinity in the disk array system according to the third embodiment.

According to the disk array system of the third embodiment, a plurality of spring clamps 113 is disposed on the other side surface of the housing 7 that opposes the side surface having the guide rails 20, and heat-transfer-accelerating units 110 to which thermally-conductive rubber is attached are disposed on the surfaces of the spring clamps 113. When inserting the disk drive 26 into the unit box 27, the spring clamps 113 urge the housing 7 against the unit box 27 due to their resilience, thereby accelerating thermal transfer. As shown in FIG. 5, the spring clamps 113 are operatively associated with a lock mechanism 120 in the disk drive 26 through a rod 121. Depression of a release button 17 cancels the urging force of the spring clamps 113. That is, the tip of the rod 121 is connected to the lock mechanism 120, and the rod 121 supported by rod bearings 122 slides therethrough when the release button 17 is depressed. The lock mechanism 120 is alternately extended and retracted by pushing the release button 17. Moving the rod 121 raises the spring clamps 113 connecting the rod 121 to the heat-transfer-accelerating unit 110, and thus the heat-transfer-accelerating unit 110 is pressed against a surface of the unit box 27.

Although in the third embodiment shown in FIGS. 4 and 5, the spring clamps 113 are disposed on one side surface of the housing 7, the spring clamps 113 may be disposed on both side surfaces of the housing 7.

Fourth Embodiment

Figure 7:
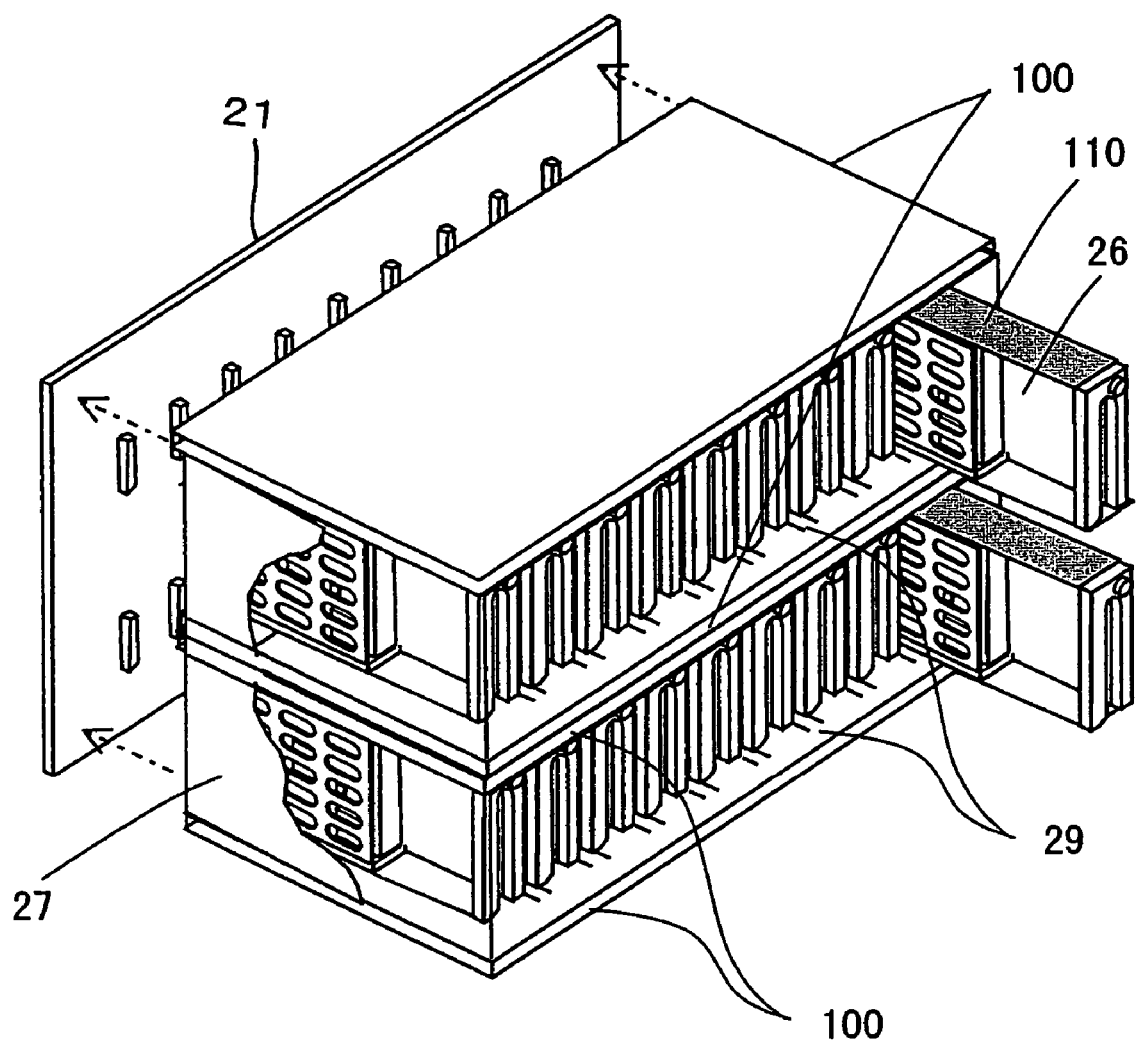
FIG. 7 is a perspective view of a disk array system including two-tiered unit boxes according to a fourth embodiment of the present invention.

FIG. 7 is a perspective view of a disk array system according to a fourth embodiment of the present invention. The disk array system of the fourth embodiment is different from that of the first embodiment shown in FIG. 1 in that another unit box 27 is disposed on top of the unit box 27. A single main circuit board 21 is disposed on the back surfaces of the two stacked unit boxes 27 and shared between the unit boxes 27. The four cold plates 100 of the fourth embodiment are provided with a refrigerant circulating system as in the first embodiment, though a radiator and ducts for the cooling system are not illustrated in FIG. 7.

According to the fourth embodiment, the two unit boxes 27 are stacked one on another, and central cooling is achieved by the cold plates 100 in each unit box 27. Therefore, even when the disk drives 26 are disposed in the bookshelf-like arrangement shown in FIG. 7, the disk drives 26 are sufficiently cooled in the disk array system, thereby achieving high-density packaging of the disk drives 26 and a high-capacity, high-speed disk array system.

Fifth Embodiment

Figure 8:
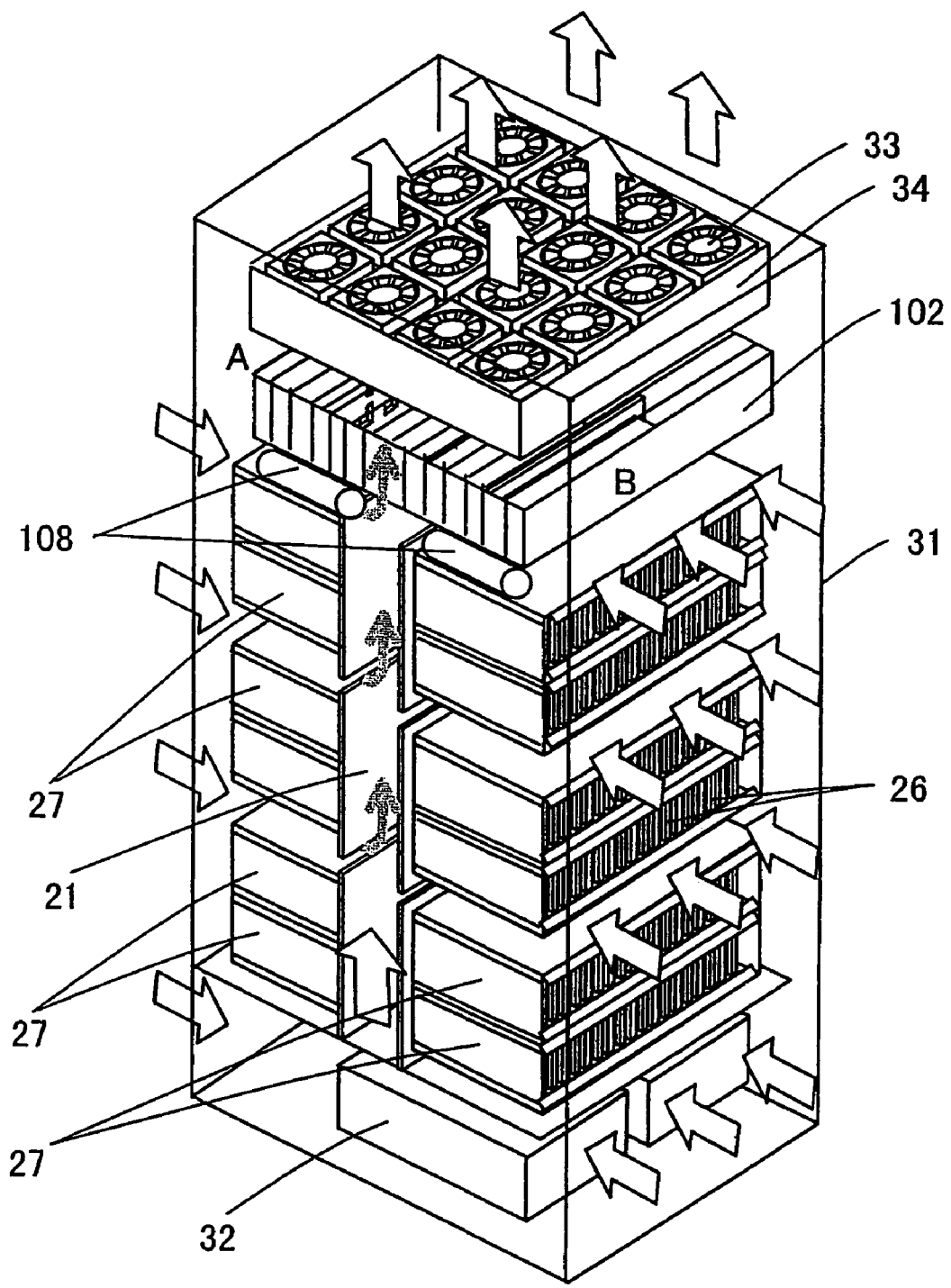
FIG. 8 is a perspective view of a large disk array system including several layers of the two-tiered unit boxes according to a fifth embodiment of the present invention.

FIG. 8 is a perspective view of a disk array system according to a fifth embodiment of the present invention. In the large disk array system of the fifth embodiment, the two-tiered unit boxes 27 as in the fourth embodiment shown in FIG. 7, which constitute one unit, are disposed on racks in a single casing 31. Large corporate disk array apparatuses often employ this arrangement according to the fifth embodiment.

As shown in FIG. 8, two columns of three layers of the two-tiered unit boxes 27 are arranged side-by-side. Six two-tiered unit boxes 27 in total are incorporated in the disk array system of the fifth embodiment. A power-supply device 32 for supplying power to the entire disk array system and a power-input unit connected to a commercial power supply are disposed in a space below the unit boxes 27 in the casing 31. A fan unit 34 including a plurality of exhaust fans 33 is disposed in a space above the unit boxes 27 in the casing 31 in order to cool the entire casing 31. Cooling air for cooling the casing 31 is introduced into the casing 31 from openings disposed in the front and back surfaces of the casing 31, as indicated by the arrows in FIG. 8 and then passes through the respective main circuit boards 21 of the two-tiered unit boxes 27. The cooling air then flows upward to be discharged outside the casing 31 through the fan unit 34.

A large radiator 102 having a size comparable to that of the fan unit 34 is disposed below the fan unit 34. Although not illustrated, the cold plates 100 in the two-tiered unit boxes 27 are connected to the radiator 102 through ducts 101 having branch connections 108, as in the first embodiment shown in FIG. 1. The branch connections 108 are disposed below the radiator 102.

The disk array system of the fifth embodiment can be readily made large, and heat from all the unit boxes 27 is effectively transferred and discharged outside in the large disk array system. Specifically, since the radiator 102 is disposed close to the fan unit 34 for exhausting air in the casing 31, the entire casing is cooled effectively due to dissipation of heat by the radiator 102, without influencing cooling of heating elements such as the disk drives 26. The radiator 102 is tilted in the casing such that the side from which the refrigerant enters is higher than the side from which the refrigerant is discharged, as in the first embodiment shown in FIG. 1.

Since the disk array system of the fifth embodiment has the aforementioned structure, the disk drives 26, which are configured in high-density packaging, are cooled more effectively, and variations in the temperatures of the disk drives 26 are minimized, thereby achieving a large-scale high-capacity, high-speed disk array system.

Although not illustrated, ducts 101 connecting the cold plates 100 to the branch connections 108 are preferably separated from the main circuit boards 21 and the power-supply device 32 by a partition. For example, a flat-plate-like partition is disposed inside and parallel to the side surface of the casing 31, and the ducts 101 are disposed between the partition and the side surface of the casing 31. Accordingly, even if the refrigerant escapes from the connecting portions of the ducts 101, the devices related to operation of the disk array system (operational devices), including the main circuit boards 21 and the power-supply device 32, are hardly influenced by the escaping refrigerant.

Sixth Embodiment

Figure 9:
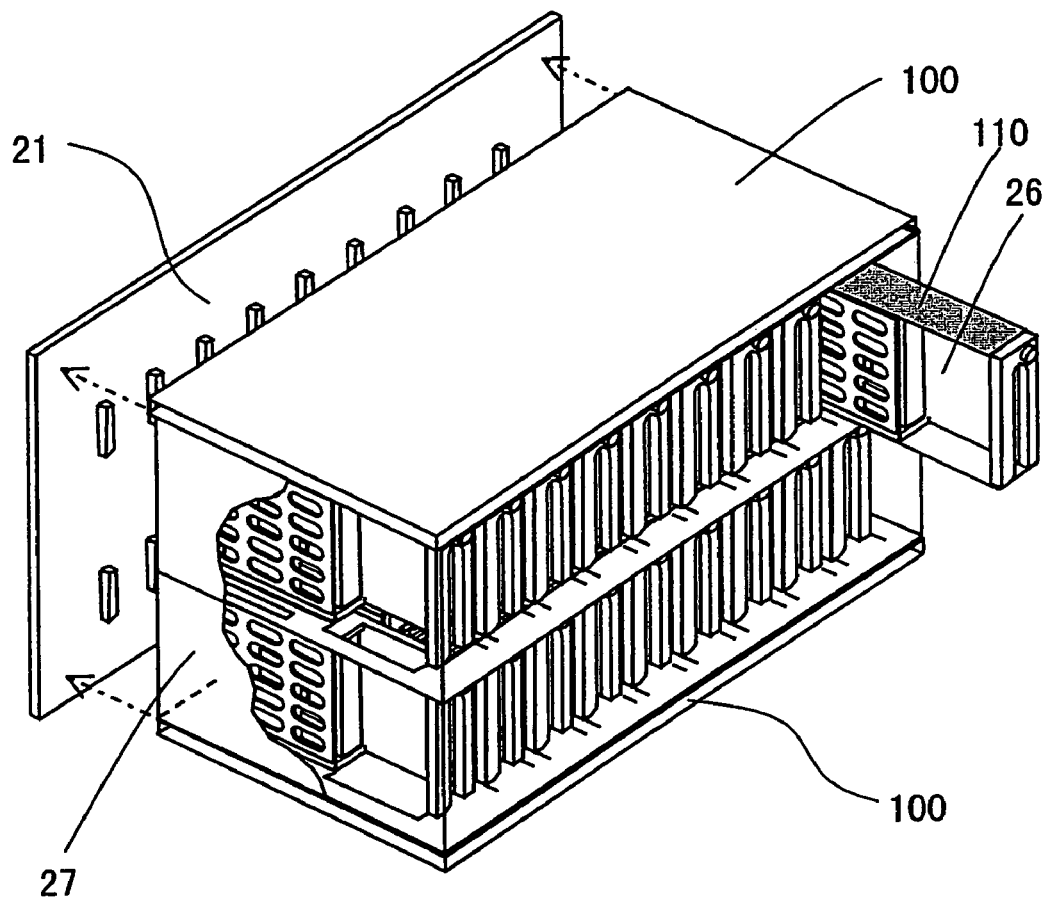
FIG. 9 is a perspective view of a disk array system including the two-tiered unit boxes according to a sixth embodiment of present invention.

FIG. 9 is a perspective view of a disk array system according to the sixth embodiment of present invention. The disk array system of the sixth embodiment is different from that of the fourth embodiment shown in FIG. 7 in that a cold plate 100 is disposed on the top and bottom surfaces of the two-tiered unit boxes 27, that is, only two cold plates 100 are provided in the disk array system. According to the sixth embodiment, heat generated at the disk drives 26 in the two-tiered unit boxes 27 is dissipated through the two cold plates 100, thereby simplifying the arrangement of ducts 101.

Seventh Embodiment

Figure 10:
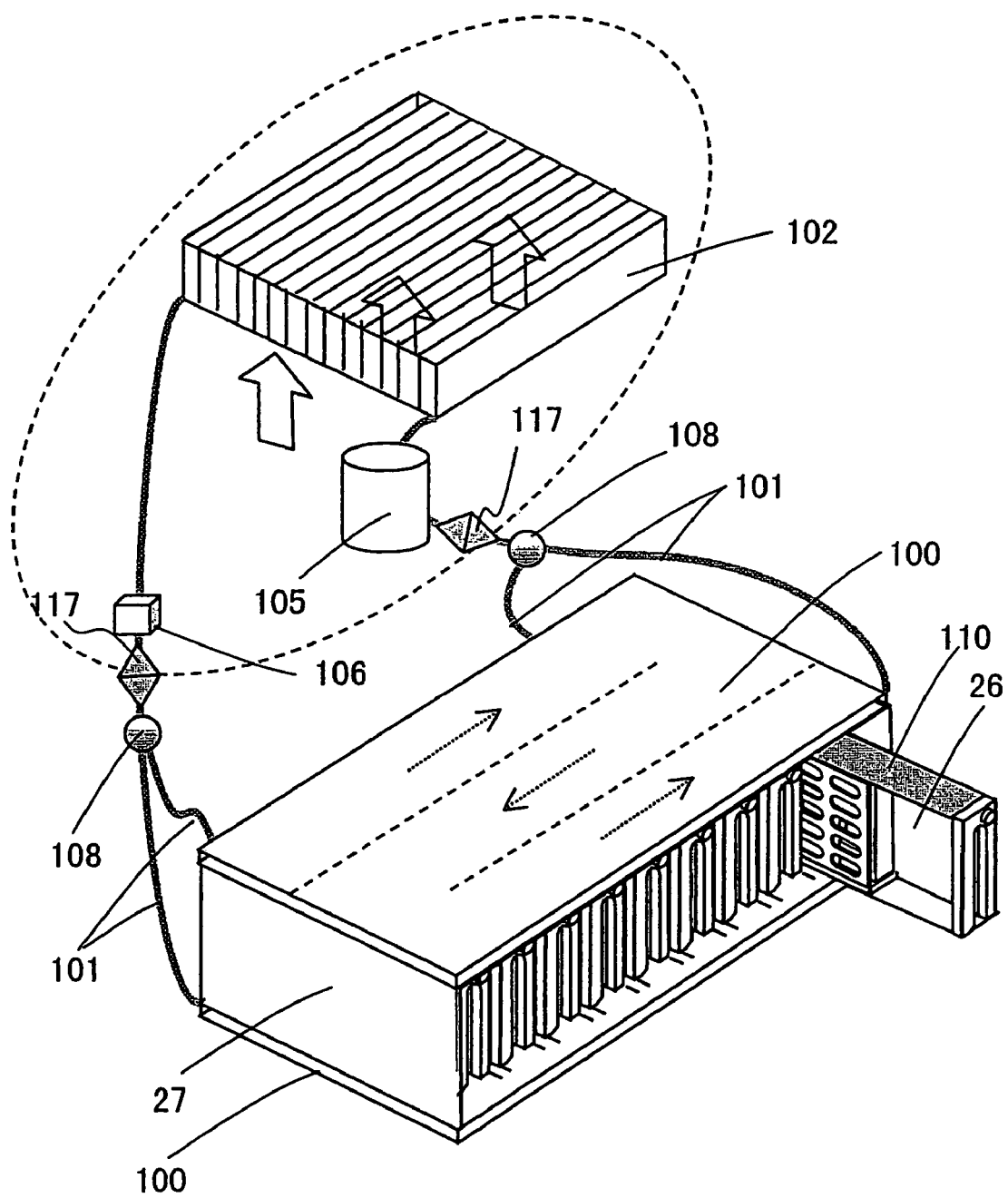
FIG. 10 is a perspective view of a disk array system and a refrigerant cycling system according to a seventh embodiment of the present invention.

FIG. 10 is a perspective view of a disk array system of a seventh embodiment of the present invention. The difference between the disk array system of the seventh embodiment and that of the first embodiment shown in FIG. 1 is the structure of the refrigerant circulating system. More specifically, according to the seventh embodiment, a compressor 105 is disposed at the duct 101 connecting the cold plates 100 to a radiator 102, whereas an expansion valve or decompressor 106 for reducing pressure is disposed at the other duct 101.

According to the seventh embodiment, since a gas-liquid two-phase refrigerant is vaporized in the cold plates 100 and the gas refrigerant is circulated by the compressor 105 to be condensed and liquefied in the radiator 102, the radiator 102 does not have to be tilted in the system. Since joints 117 allow main cooling devices such as the compressor 105 and the radiator 102 to be detached from the unit box 27, the unit box 27 can be readily separated from the main cooling devices, thereby improving the productivity of manufacturing the disk array system.

Specifically, since a refrigeration cycle of the gas-liquid two-phase refrigerant is established in the disk array system of the seventh embodiment, the temperatures of the cold plates 100 can be set below room temperature or a larger amount of heat can be dissipated. Accordingly, higher-density recording can be achieved in the disk bodies 1. Since the temperatures of the cold plates 100 can be made lower than room temperature, the disk array system of the seventh embodiment can be used in high-temperature environments, such as desert areas.

Eighth Embodiment

Figure 11:
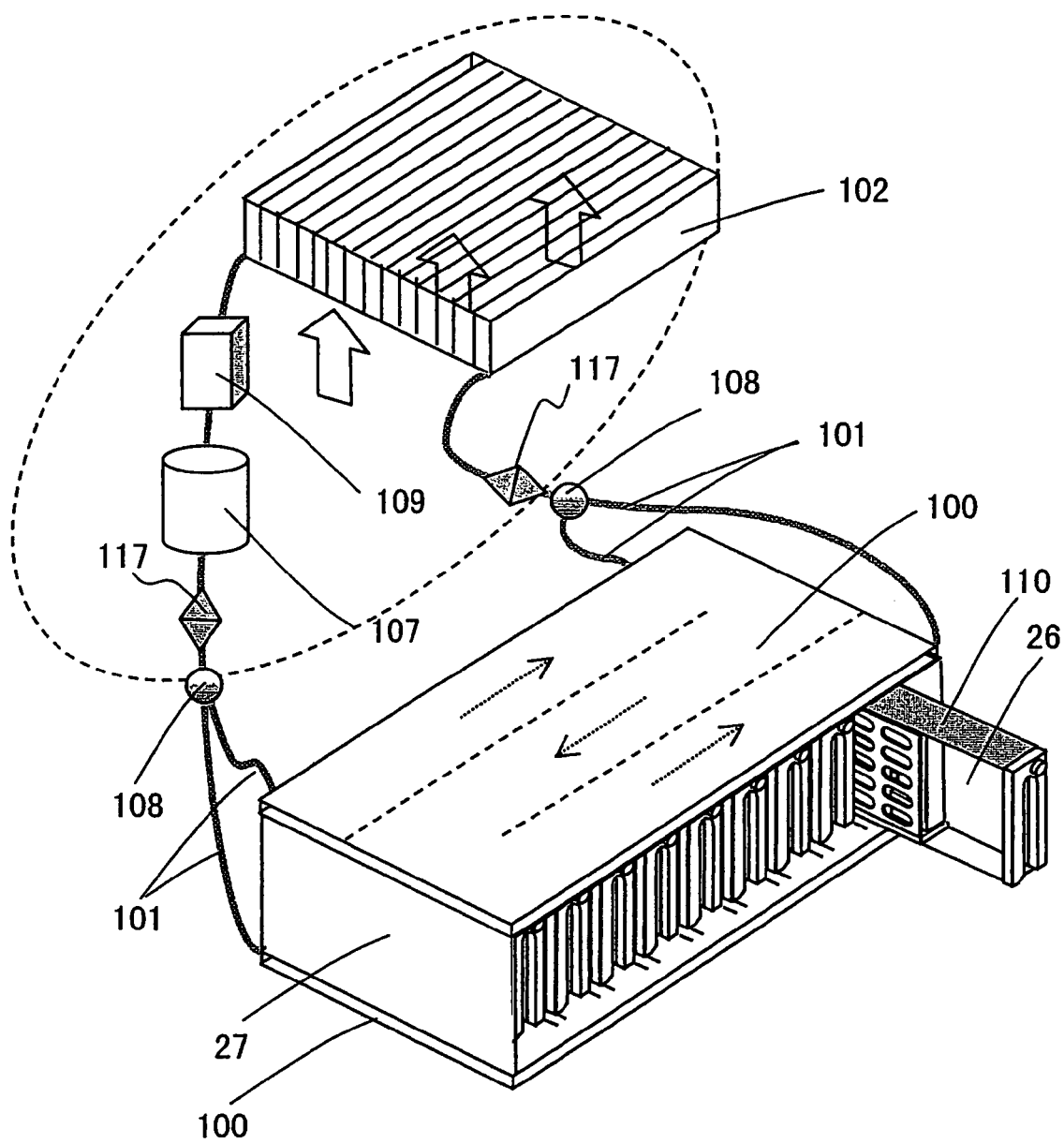
FIG. 11 is a perspective view of a disk array system and a refrigerant cycling system according to an eighth embodiment of the present invention.

FIG. 11 is a perspective view of a disk array system according to an eighth embodiment of the present invention. The disk array system of the eighth embodiment is different from those of the above embodiments, e.g., that shown in FIG. 1, in that a liquid refrigerant such as water or antifreeze is used as a refrigerant flowing through the cold plates 100, in place of the gas-liquid two-phase refrigerant such as R134a. A pump 107 for circulating the liquid refrigerant and a tank 109 for containing the refrigerant are provided at a duct 101 connecting cold plates 100 to a radiator 102. The refrigerant is circulated by the pump 107 and thus the radiator 102 does not have to be tilted in the system. Joints 117 allow main cooling devices such as the pump 107 and the radiator 102 to be detached from a unit box 27.

According to the eighth embodiment, since a large amount of heat is dissipated, higher-density recording can be achieved in disk bodies 1. The pump 107 is disposed downstream of the radiator 102 and thus cooled liquid flows into the pump 107, thereby improving the reliability of the pump 107. Alternatively, the pump 107 may be disposed upstream of the radiator 102.

According to the disk array system of the eighth embodiment, since heat is dissipated by using the single radiator 102 for the entire disk array system, the cooling of the disk drives 26 is not influenced by local air velocity or air-temperature distribution, which occurs in a known disk array system. The temperatures of the cold plates 100 are almost uniform, which, in turn, renders the temperatures of the cooled disk drives 26 uniform.

Ninth Embodiment

Figure 12:
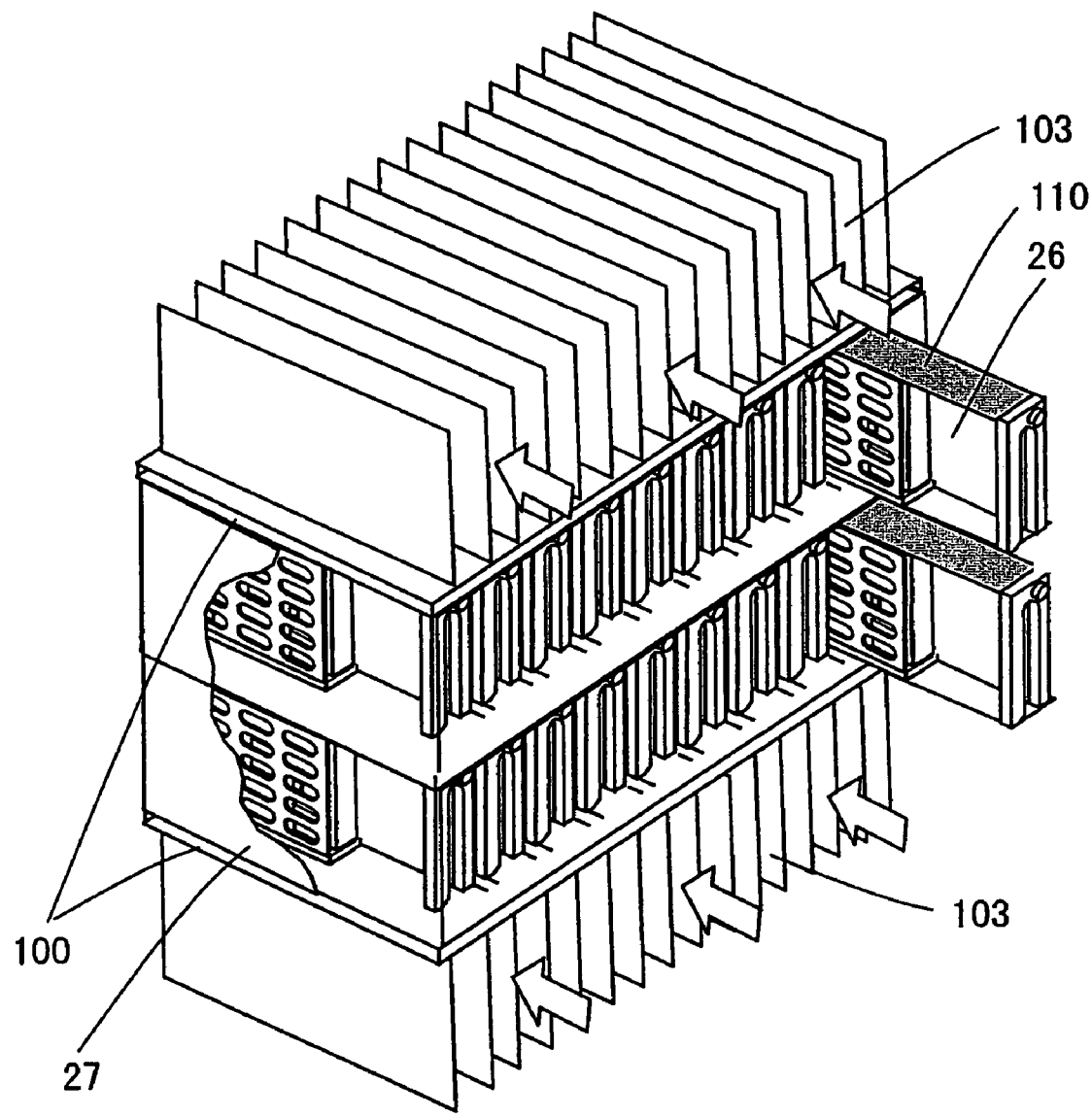
FIG. 12 is a perspective view of a disk array system according to a ninth embodiment of the present invention.

FIG. 12 is a perspective view of a disk array system according to a ninth embodiment of the present invention. In the disk array system of the ninth embodiment, fins 103 are directly attached to cold plates 100, in place of the radiator 102 in the disk array system according to the sixth embodiment shown in FIG. 9. Cooling air flows into the fins 103 by, e.g., an exhaust fan (not shown), as indicated by the arrows in FIG. 12, thereby cooling the disk array system. According to the ninth embodiment, the radiator 102 and the ducts 101 are unnecessary.

Tenth Embodiment

Figure 13:
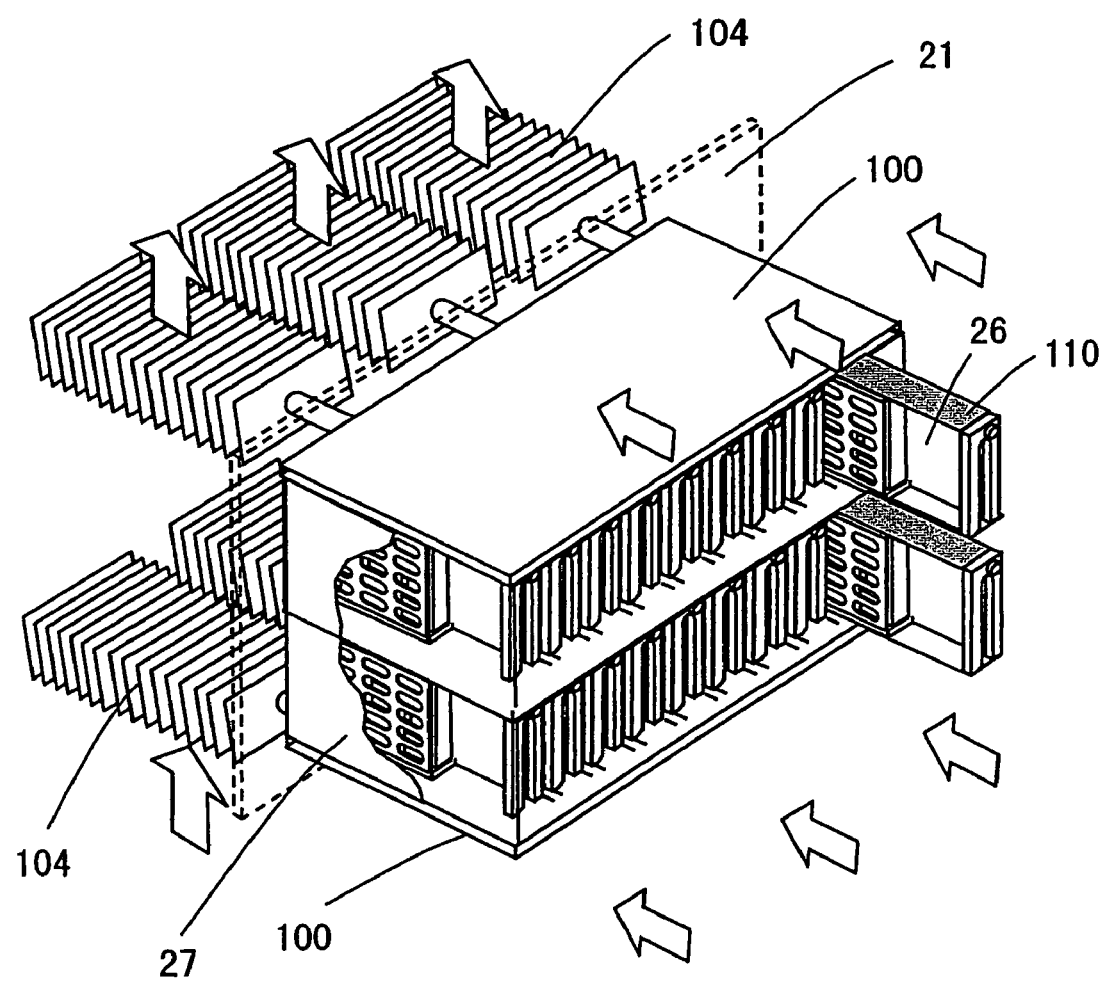
FIG. 13 is a perspective view of a disk array system of a tenth embodiment according to the present invention.

FIG. 13 is a perspective view of a disk array system of a tenth embodiment of the present invention. In the disk array system of the tenth embodiment, heat pipes 104 provided with fins are thermally coupled to cold plates 100, in place of the fins 103 in the disk array system of the ninth embodiment shown in FIG. 12. The heat pipes 104 with the fins are disposed in a relatively large space at the back of a main circuit board 21, whereby the fins have sufficiently large areas.

Although in the tenth embodiment three heat pipes 104 are disposed for each unit box 27, as shown in FIG. 13, the number of heat pipes is not limited thereto and can be determined depending on the conditions of the disk array system, such as the amount of generated heat. Furthermore, the shape of the heat pipe is not limited to the circular cross section; a flat heat pipe may also be used. Although heat is typically transferred by repeating vaporization and condensation of the refrigerant in the heat pipe, a heat pipe may transfer heat by liquid vibration or liquid circulation.

Eleventh Embodiment

Figure 14:
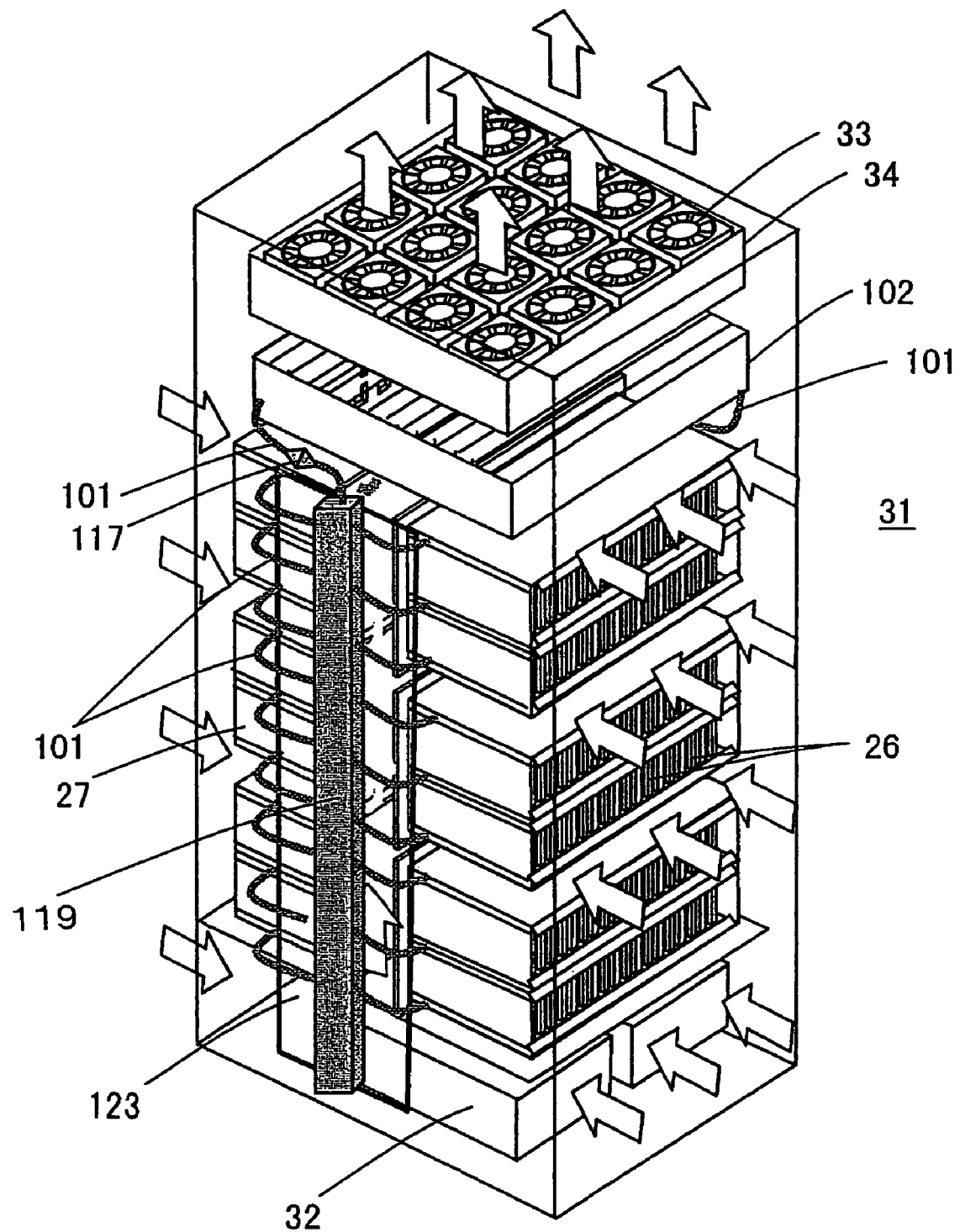
FIG. 14 is a perspective view of a large disk array system according to an eleventh embodiment of the present invention.

FIG. 14 is a perspective view of a disk array system according to an eleventh embodiment of the present invention. The disk array system of the eleventh embodiment is different from that of the fifth embodiment shown in FIG. 8 in that upright headers 119 extend along the height direction of a casing 31 inside the inner surfaces of the casing 31, in place of the branch connections 108 for the ducts 101 of the fifth embodiment. That is, the headers 119 extend substantially across the entire height of stacked unit boxes 27 including a plurality of disk drives 26. Ducts 101 from cold plates 100 of each unit box 27 are connected to the headers 119 at almost identical vertical positions, leading to a simplified duct system. With this structure, however, resistance of the liquid refrigerant in the refrigerant channel differs between the upper unit box 27 and the lower unit box 27 due to the gravity of the refrigerant, resulting in nonuniform distribution of the refrigerant. Thus, in the eleventh embodiment, an opening ratio of the connecting portions of the ducts 101 connected to the headers 119 is made different depending on the position of the ducts 101 in the height direction of the headers 119 so that the distribution of the refrigerant is adjusted. Alternatively, the cross-sectional area of the headers 119 may be varied in the height direction thereof.

By providing flat-plate-like partitions 123 inside the headers 119, operational devices including main circuit boards 21 and a power-supply device 32 are separated from the ducts 101 and the header 119. Accordingly, even if the refrigerant escapes from the connecting portions of the ducts 101, the operational devices are hardly influenced by the escaping refrigerant, leading to improved reliability of the large disk array system.

Since joints 117 are disposed at the ducts 101 connecting the headers 119 to the radiator 102, main cooling devices disposed close to the radiator 102 can be separated from the stacked unit boxes 27. The provision of the joint 17 facilitates fabrication and assembling of the system. The refrigerant circuit of the eleventh embodiment may be applied to the disk array systems of the first, seventh, and eighth embodiments respectively shown in FIGS. 1, 10, and 11.

Twelfth Embodiment

Figure 15:
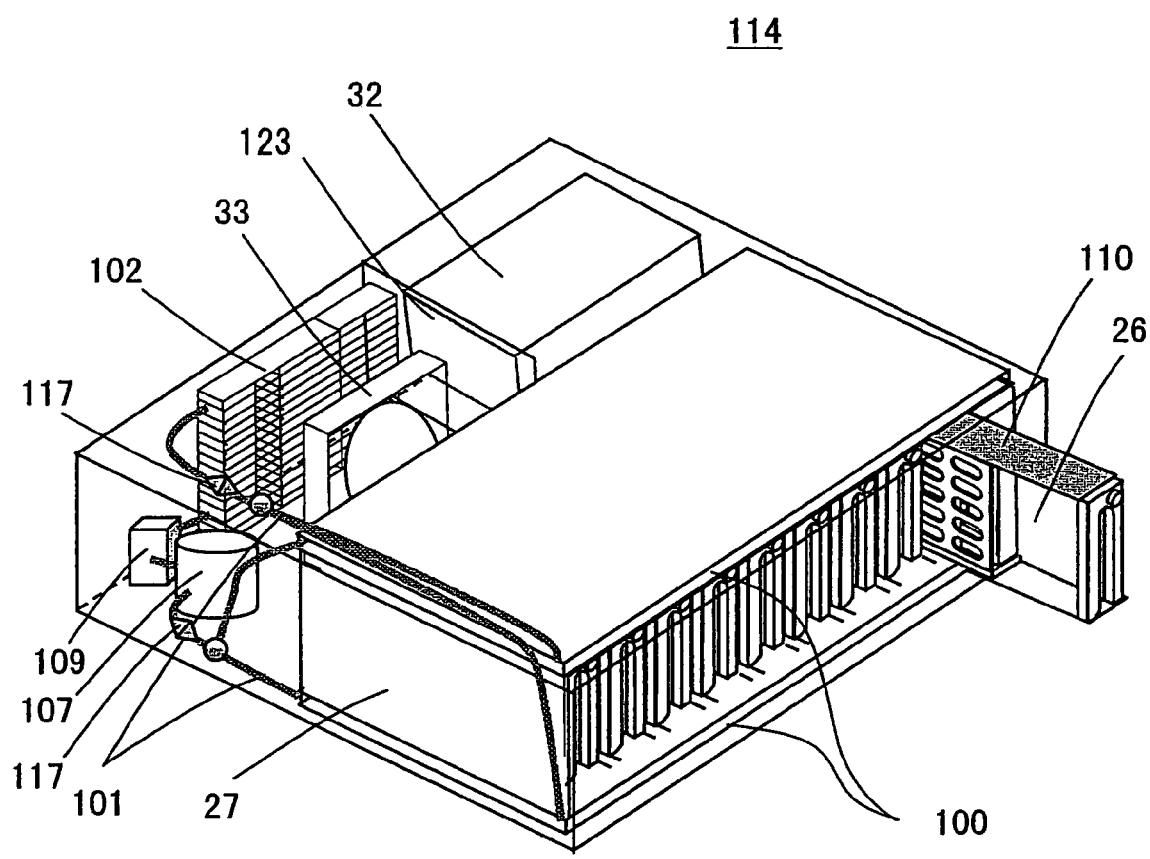
FIG. 15 is a perspective view of a disk array system including a unit casing according to a twelfth embodiment of the present invention.

FIG. 15 is a perspective view of a disk array system according to a twelfth embodiment of the present invention. The disk array system of the twelfth embodiment is different from the disk array systems of the above embodiments in that a unit box 27, cooling devices, and a power supply are accommodated in a unit casing 114. As shown in FIG. 15, within the unit casing 114, the unit box 27 is placed close to the front surface of the unit casing 114, operational devices including a power-supply device 32, an unillustrated mother board and an unillustrated I/O substrate are placed on the right side close to the back surface of the unit casing 114, and cooling devices including a radiator 102, a fan 33, a pump 107 for circulating the refrigerant, and a tank 109 for containing the refrigerant are placed on the left side close to the back surface of the unit casing 114.

A partition 123 separates the space for the operational devices from the space for the cooling devices. Accordingly, the operational devices including the power-supply device 32 are separated from the cooling devices including the ducts 101. Accordingly, even if the refrigerant escapes from the connecting portions of the ducts 101, the operational devices are hardly influenced by the escaping refrigerant, leading to improved reliability of the large disk array system. The cooling devices, constituting one unit, are connected to the cold plates 100 in the unit box 27 through the joints 117. The provision of the joints 117 facilitates assembling of the unit casing 114.

Figure 16:
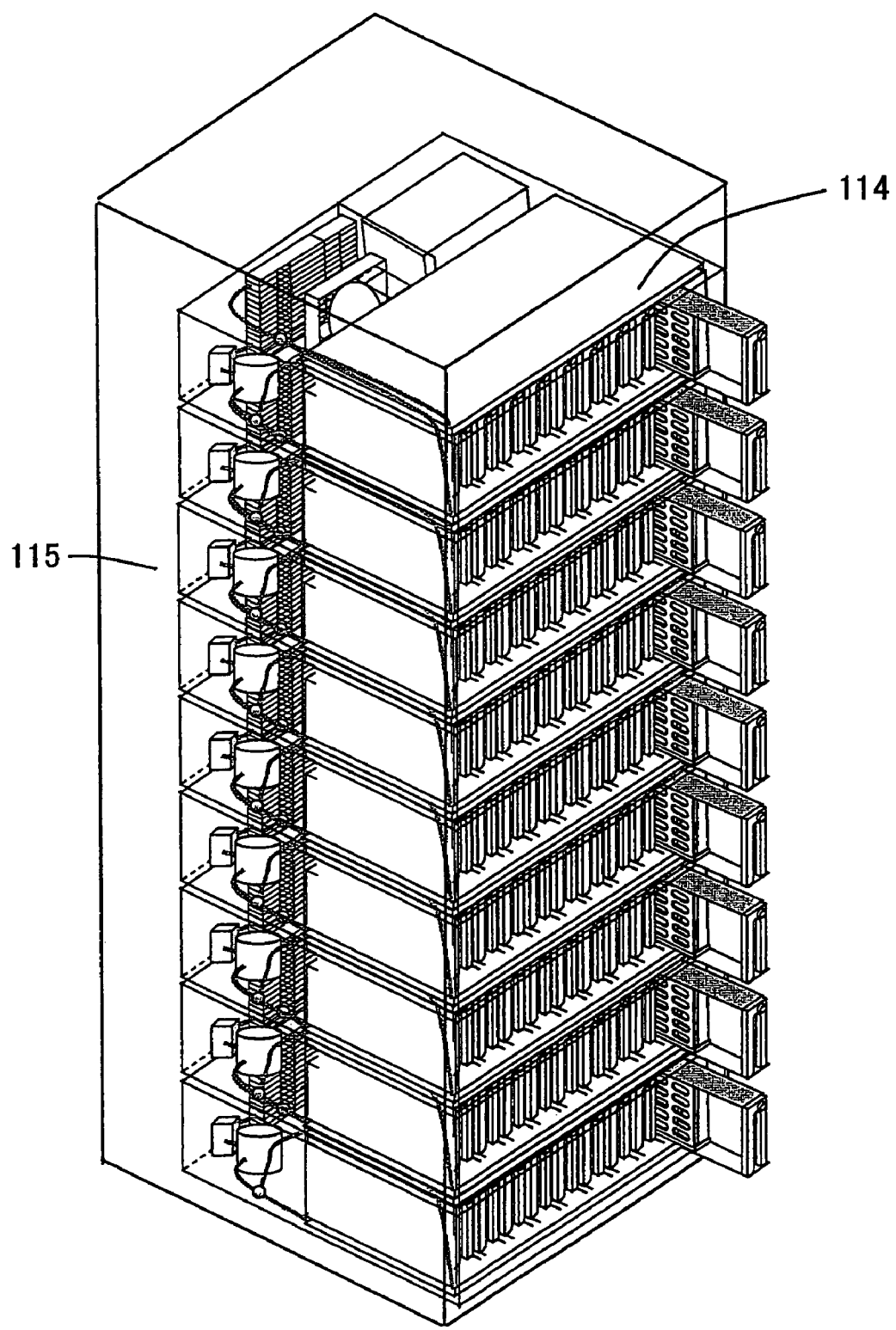
FIG. 16 is a perspective view of a large disk array system according to a modification of the disk array system of the twelfth embodiment.

FIG. 16 is a perspective view of a large disk array system according to a modification of the disk array system of the twelfth embodiment. Referring to FIG. 16, a plurality of the unit casing 114 is disposed on racks in a large casing 115. With the large disk array system of the modification, a space in the back of the stacked unit casings 114 is used for wiring.

According to the disk array system of the modification, cooling air passing through the radiator 102 is discharged from the back of the unit casing 114 to the large casing 115. The wiring space in the back of the large casing 115 can be utilized as an exhaust area for the entire unit casing 114. If operational devices such as an I/O connector account for a lot of space in the back of the large casing 115, cooling air may be exhausted through the side surfaces of the large casing 115. According to the disk array systems of the twelfth embodiment and its modification, alternatively, a compressor 105 may be disposed at the duct 101 connecting the cold plates 100 to the radiator 102, while an expansion valve 106 may be disposed at the other duct 101, in place of the pump 107 and the tank 109.

Thirteenth Embodiment

Figure 17:
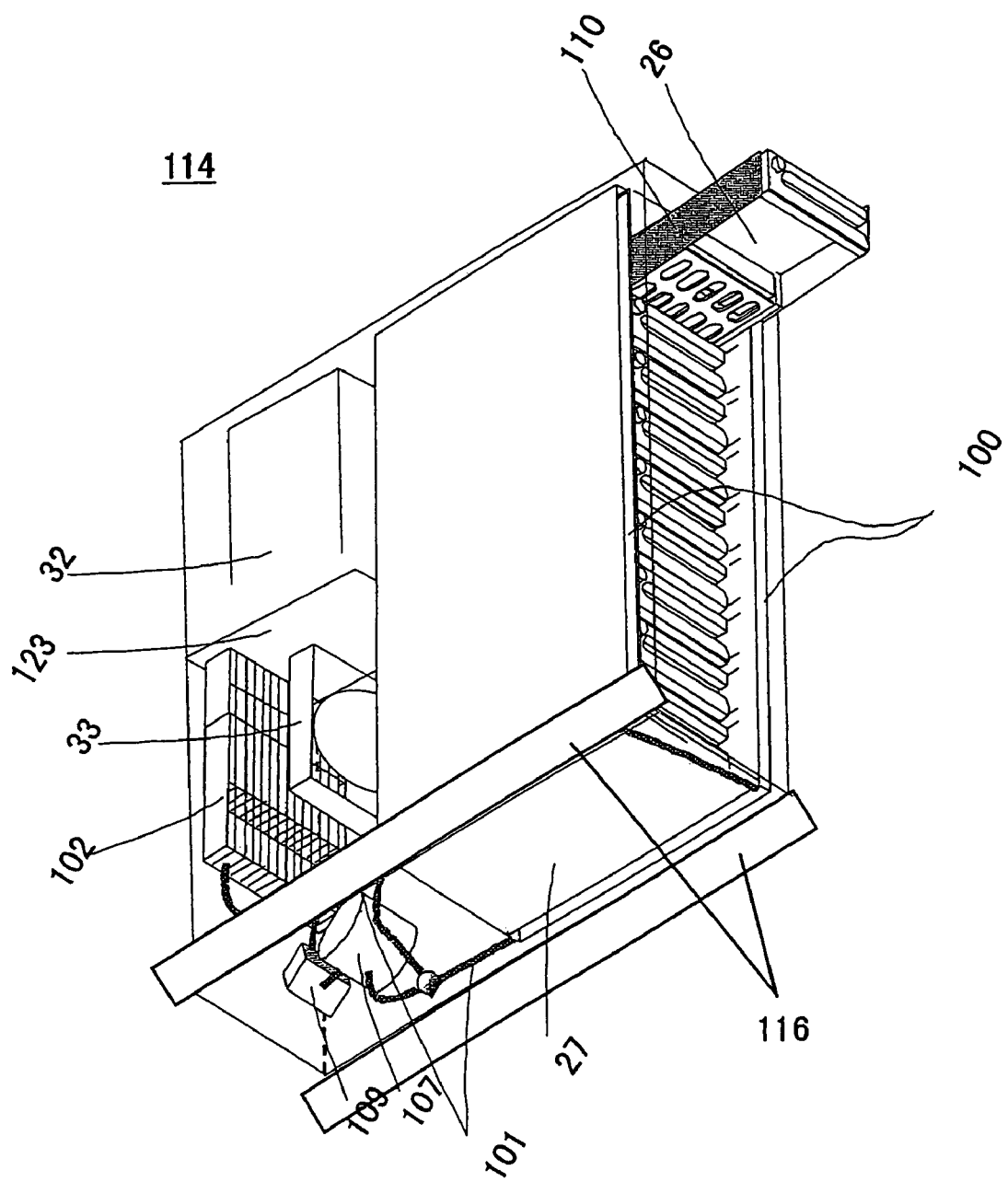
FIG. 17 is a perspective view of a disk array system including a unit casing with legs according to a thirteenth embodiment of the present invention.

FIG. 17 is a perspective view of a disk array system according to a thirteenth embodiment of the present invention. The disk array system of the thirteenth embodiment is different from that of the twelfth embodiment shown in FIG. 15 in that legs 116 are disposed on the left side surface of the unit casing 114 in FIG. 17 such that the unit casing 114 can be placed upright with the legs 116 down. In FIG. 17, the unit casing 114 is viewed obliquely from the bottom. According to the disk array system of the thirteenth embodiment, cooling devices such as the pump 107 are disposed in the bottom. Therefore, even if liquid leaks, the operational devices are hardly influenced by the leakage. With the thirteenth embodiment, also, cooling air passing through the radiator 102 is discharged from the back of the unit casing 114. With this structure, a sufficient exhaust area can be secured.

What is claimed is:

1. The disk array system comprising:
a plurality of disk drives; and
at least one unit box including the plurality of disk drives aligned in the thickness direction of the disk drive, the plurality of disk drives comprising:
a thin case accommodating a recording disk, a read/write head, and a driving mechanism for driving the recording disk and the read/write head; and
a control board for controlling the driving mechanism, the control board being mounted on the thin case, wherein
the thin case and the unit box are comprised of a thermally-conductive material, the unit box has surfaces parallel to the thickness direction of the plurality of disk drives, and at least one of the surfaces of the unit box includes a heat absorption unit filled with a refrigerant, wherein the disk drive is accommodated in a box-shaped housing comprised of a thermally-conductive material, the housing is removably disposed in the unit box, and a heat-transfer accelerating unit is disposed between inner surfaces of the unit box and side surfaces of the housing facing the inner surfaces of the unit box so as to fill the gap between the inner surfaces of the unit box and the side surfaces of the housing, the heat-transfer accelerating unit accelerating thermal coupling of the unit box and the housing, wherein side surfaces of the thin case are fixed to inner surfaces of the housing via a thermally-conductive component, the control board is mounted on a first outer surface of the thin case, and a second outer surface of the thin case is attached to an inner bottom surface of the housing through a thermally-conductive flexible component.

2. The disk array system according to claim 1, further comprising another unit box stacked on the unit box, the top surface of the top unit box and the lower surface of the bottom unit box having the heat absorption unit.

3. The disk array system according to claim 1, wherein the heat absorption unit is comprised of a plate including a refrigerant channel through which the refrigerant passes, and ducts connect two edges of the refrigerant channel in the heat absorption unit to two respective edges of a refrigerant channel in a radiator disposed remote from the unit box.

4. The disk array system according to claim 3, wherein the radiator is disposed above the unit box, and the refrigerant spontaneously circulates through the heat absorption unit, the ducts, and the radiator.

5. The disk array system according to claim 1,
wherein the heat-transfer accelerating unit is comprised of thermally-conductive rubber, thermally-conductive grease, or a thermally-conductive spring.

6. The disk array system according claim 1,
wherein the heat-transfer accelerating unit is comprised of a guiding groove for inserting/removing the housing into/from the unit box, the guiding groove engaging the side surfaces of the housing and the inner surfaces of the unit box.

7. The disk array system comprising:
a plurality of disk drives; and
at least one unit box including the plurality of disk drives aligned in the thickness direction of the disk drive, the plurality of disk drives comprising:
a thin case accommodating a recording disk, a read/write head, and a driving mechanism for driving the recording disk and the read/write head; and
a control board for controlling the driving mechanism, the control board being mounted on the thin case, wherein
the thin case and the unit box are comprised of a thermally-conductive material, the unit box has surfaces parallel to the thickness direction of the plurality of disk drives, and at least one of the surfaces of the unit box includes a heat absorption unit filled with a refrigerant,
wherein the heat absorption unit is comprised of a plate including a refrigerant channel through which the refrigerant passes, and ducts connect two edges of the refrigerant channel in the heat absorption unit to two respective edges of a refrigerant channel in a radiator disposed remote from the unit box
wherein the refrigerant is a gas-liquid two-phase refrigerant, a compressor for compressing the refrigerant is disposed at one of the ducts, and a decompressor is disposed at the other duct.

8. The disk array system according to claim 3 or 7, wherein a pump for circulating the refrigerant is disposed at one of the ducts.

9. The disk array system according to claim 3 or 7, further comprising a cooling fan for cooling the radiator.

10. The disk array system according to claim 7,
wherein the thin case is disposed close to the back of the unit box, and the refrigerant channel in the heat absorption unit meanders along the longitudinal direction of the unit box such that the refrigerant flows through the refrigerant channel from the back to the front of the unit box.

11. The disk array system according to claim 7, further comprising
a casing including a plurality of racks on which the respective unit boxes are placed;
a power-supply unit disposed at the bottom of the casing; and
an exhaust fan for introducing air from openings on side surfaces of the casing and exhausting from the top surface of the casing, wherein
the heat absorption unit in each of the plurality of unit boxes is comprised of a plate including a refrigerant channel through which the refrigerant passes, and ducts connect two ends of the refrigerant channel in the heat absorption unit to two respective ends of a refrigerant channel in the radiator disposed in the airflow of the exhaust fan.

12. The disk array system comprising:
a plurality of disk drives; and
at least one unit box including the plurality of disk drives aligned in the thickness direction of the disk drive, the plurality of disk drives comprising:
a thin case accommodating a recording disk, a read/write head, and a driving mechanism for driving the recording disk and the read/write head; and
a control board for controlling the driving mechanism, the control board being mounted on the thin case, wherein
the thin case and the unit box are comprised of a thermally-conductive material, the unit box has surfaces parallel to the thickness direction of the plurality of disk drives, and at least one of the surfaces of the unit box includes a heat absorption unit filled with a refrigerant,
wherein the heat absorption unit is comprised of a plate including a refrigerant channel through which the refrigerant passes, and ducts connect two edges of the refrigerant channel in the heat absorption unit to two respective edges of a refrigerant channel in a radiator disposed remote from the unit box,
wherein the radiator is disposed above the unit box, and the refrigerant spontaneously circulates through the heat absorption unit, the ducts, and the radiator,
wherein the thin case is disposed close to the back of the unit box, and the refrigerant channel in the heat absorption unit meanders along the longitudinal direction of the unit box such that the refrigerant flows through the refrigerant channel from the back to the front of the unit box.

13. The disk array system comprising:
a plurality of disk drives; and
at least one unit box including the plurality of disk drives aligned in the thickness direction of the disk drive, the plurality of disk drives comprising:
a thin case accommodating a recording disk, a read/write head, and a driving mechanism for driving the recording disk and the read/write head; and
a control board for controlling the driving mechanism, the control board being mounted on the thin case, wherein
the thin case and the unit box are comprised of a thermally-conductive material, the unit box has surfaces parallel to the thickness direction of the plurality of disk drives, and at least one of the surfaces of the unit box includes a heat absorption unit filled with a refrigerant, wherein the heat absorption unit includes at least one heat pipe filled with the refrigerant, one end of the heat pipe being connected to the heat absorption unit, and a radiator is disposed at the other end of the heat pipe.

14. The disk array system according to claim 13, wherein the heat absorption unit is comprised of a cold plate having a space filled with the refrigerant, the cold plate comprising the surface of the unit box, the cold plate including at least one fin on an outer surface of the cold plate.

15. The disk array system comprising:
a plurality of disk drives; and
at least one unit box including the plurality of disk drives aligned in the thickness direction of the disk drive, the plurality of disk drives comprising:
a thin case accommodating a recording disk, a read/write head, and a driving mechanism for driving the recording disk and the read/write head; and
a control board for controlling the driving mechanism, the control board being mounted on the thin case, wherein
the thin case and the unit box are comprised of a thermally-conductive material, the unit box has surfaces parallel to the thickness direction of the plurality of disk drives, and at least one of the surfaces of the unit box includes a heat absorption unit filled with a refrigerant,
wherein the heat absorption unit is comprised of a plate including a refrigerant channel through which the refrigerant passes, and ducts connect two edges of the refrigerant channel in the heat absorption unit to two respective edges of a refrigerant channel in a radiator disposed remote from the unit box,
wherein the radiator is disposed above the unit box, and the refrigerant spontaneously circulates through the heat absorption unit, the ducts, and the radiator, wherein at least one unit box comprises a plurality of unit boxes, the disk array system further comprising:
a casing including a plurality of racks on which the respective unit boxes are placed;
a power-supply unit disposed at the bottom of the casing; and
an exhaust fan for introducing air from openings on side surfaces of the casing and exhausting from the top surface of the casing, wherein
the heat absorption unit in each of the plurality of unit boxes is comprised of a plate including a refrigerant channel through which the refrigerant passes, and ducts connect two ends of the refrigerant channel in the heat absorption unit to two respective ends of a refrigerant channel in the radiator disposed in the airflow of the exhaust fan.

16. A disk array system comprising:
a plurality of disk drives; and
at least one unit box including the plurality of disk drives aligned in the thickness direction of the disk drive, the plurality of disk drives comprising:
a thin case accommodating a recording disk, a read/write head, and a driving mechanism for driving the recording disk and the read/write head; and
a control board for controlling the driving mechanism, the control board being mounted on the thin case, wherein
the thin case and the unit box are comprised of a thermally-conductive material, the unit box has surfaces parallel to the thickness direction of the plurality of disk drives, and at least one of the surfaces of the unit box includes a heat absorption unit filled with a refrigerant,
wherein the heat absorption unit is comprised of a plate including a refrigerant channel through which the refrigerant passes, and ducts connect two edges of the refrigerant channel in the heat absorption unit to two respective edges of a refrigerant channel in a radiator disposed remote from the unit box,
wherein the refrigerant is a gas-liquid two-phase refrigerant, a compressor for compressing the refrigerant is disposed at one of the ducts, and a decompressor is disposed at the other duct, and
wherein the thin case is disposed close to the back of the unit box, and the refrigerant channel in the heat absorption unit meanders along the longitudinal direction of the unit box such that the refrigerant flows through the refrigerant channel from the back to the front of the unit box.

17. A disk array system comprising:
a plurality of disk drives; and
at least one unit box including the plurality of disk drives aligned in the thickness direction of the disk drive, the plurality of disk drives comprising:
a thin case accommodating a recording disk, a read/write head, and a driving mechanism for driving the recording disk and the read/write head; and
a control board for controlling the driving mechanism, the control board being mounted on the thin case, wherein
the thin case and the unit box are comprised of a thermally-conductive material, the unit box has surfaces parallel to the thickness direction of the plurality of disk drives, and at least one of the surfaces of the unit box includes a heat absorption unit filled with a refrigerant,
wherein the heat absorption unit is comprised of a plate including a refrigerant channel through which the refrigerant passes, and ducts connect two edges of the refrigerant channel in the heat absorption unit to two respective edges of a refrigerant channel in a radiator disposed remote from the unit box,
wherein a pump for circulating the refrigerant is disposed at one of the ducts, and a plurality of disk drives; and
at least one unit box including the plurality of disk drives aligned in the thickness direction of the disk drive, the plurality of disk drives comprising:
a thin case accommodating a recording disk, a read/write head, and a driving mechanism for driving the recording disk and the read/write head; and
a control board for controlling the driving mechanism, the control board being mounted on the thin case, wherein
the thin case and the unit box are comprised of a thermally-conductive material, the unit box has surfaces parallel to the thickness direction of the plurality of disk drives, and at least one of the surfaces of the unit box includes a heat absorption unit filled with a refrigerant,
wherein the heat absorption unit is comprised of a plate including a refrigerant channel through which the refrigerant passes, and ducts connect two edges of the refrigerant channel in the heat absorption unit to two respective edges of a refrigerant channel in a radiator disposed remote from the unit box,
wherein the radiator is disposed above the unit box, and the refrigerant spontaneously circulates through the heat absorption unit, the ducts, and the radiator, and
wherein the thin case is disposed close to the back of the unit box, and the refrigerant channel in the heat absorption unit meanders along the longitudinal direction of the unit box such that the refrigerant flows through the refrigerant channel from the back to the front of the unit box.

* * * * *